United States Patent [19]
Nonaka et al.

[11] Patent Number: 5,489,794
[45] Date of Patent: Feb. 6, 1996

[54] SEMICONDUCTOR DEVICE

[75] Inventors: Koju Nonaka; Shigeyuki Tsunoda; Kenji Kitamura, all of Tokyo, Japan

[73] Assignee: Seiko Instruments Inc., Japan

[21] Appl. No.: 64,707

[22] Filed: May 20, 1993

[30] Foreign Application Priority Data

May 22, 1992 [JP] Japan ..................................... 4-131076
Mar. 17, 1993 [JP] Japan ..................................... 5-057555

[51] Int. Cl.⁶ ..................................................... H01L 29/68
[52] U.S. Cl. ............................ 257/369; 257/376; 257/463
[58] Field of Search ..................................... 257/369, 403, 257/376

[56] References Cited

U.S. PATENT DOCUMENTS 4,799,092  1/1989  Klaassen ................................. 257/403

OTHER PUBLICATIONS

International Electron Devices Meeting, Dec. 5, 1983, Washington, D.C., pp. 534–537, Shang–yi Chiang et al., "Optimization of sub–micron P–channel FET structure".

Patent Abstracts Of Japan, vol. 011, No. 254 (E533), Aug. 18, 1987.

1989 Symposium on VLSI Technology Digest of Technical Papers, May 22, 1989 Kyoto, Japan, pp. 13–14, Y. Okazaki et al., "A High Performance 0.22 um Gate CMOS Technology".

Extended Abstracts, vol. 87, No. 1, 1987 (Spring), Princeton, N.J., p. 211, Y. Nishi, "CMOS Technology Status and Challenges".

Primary Examiner—Edward Wojciechowicz
Attorney, Agent, or Firm—Adams & Wilks

[57] ABSTRACT

The semiconductor device contains a CMOS transistor pair comprised of a P channel MOS transistor having a polysilicon gate 4 and an N channel MOS transistor having a polysilicon gate. The MOS transistor has a channel dope layer 5 localized in a vicinity of a surface of a channel region just below a gate electrode. This channel dope layer 5 has a quite shallow p-n junction depth xj effective to suppress a leak current. Thereby, an amount of impurity concentration in the surface of the channel region can be reduced to improve a subthreshold characteristics of the MOS transistor and to enable a low voltage and high speed operation under suppressing a leakage current.

22 Claims, 11 Drawing Sheets

C-V CHARACTERISTICS

SEMICONDUCTOR DEVICE

BACKGROUND OF THE INVENTION

The present invention relates to a semiconductor device and a method of producing the same. Particularly, the invention relates to semiconductor device and production method of the a CMOS transistor pair composed of a P channel MOS transistor having a polysilicon gate and an N channel MOS transistor having a polysilicon gate. More specifically, the invention relates to the semiconductor device and production method of the same operable at a low voltage of about 1.5 V and at a high speed.

In the ordinary silicon gate technology, an N type polysilicon gate is doped with a great amount of phosphorus and a P type polysilicon gate is doped with a great amount of boron. These gates are formed on a silicon substrate or on an ion-implanted well layer in a silicon substrate. If the gate electrode material is utilized as a gate electrode of a MOS transistor, such as an N type polysilicon gate for an N channel MOS transistor, a work function difference is relatively great between the semiconductor substrate and the polysilicon so that a threshold voltage is lowered. Therefore, normally a channel region is ion-implanted with an impurity such as boron having the same electroconductivity type as that of the substrate, so as to regulatively raise the threshold voltage. On the other hand, if the gate electrode material is utilized as a different type of gate electrode material from a channel type of a MOS transistor such as N type polysilicon gate for a P channel MOS transistor, a work function difference is relatively small between the semiconductor substrate and the polysilicon gate electrode, hence the threshold voltage is negatively shifted. Therefore, in order to regulate an absolute value of the threshold voltage to a smaller level, an impurity such as boron having an opposite electroconductivity type to the semiconductor substrate is ion-implanted into the channel region of the substrate. Consequently, a P-N junction is formed. The former case is called a surface channel type device, and the later case is called a buried channel type device. The P channel MOS transistor and the N channel MOS transistor are coupled to one another to constitute a complementary pair, i.e., CMOS transistor pair.

In the CMOS technology, as the amount of boron doped into the channel region is increased, a threshold voltage of an N channel MOS transistor having the surface channel type is raised and a threshold voltage of a P channel MOS transistor having the buried channel type is lowered.

The semiconductor integrated circuit device containing a CMOS transistor pair as a basic element constitutes a CMOS IC which is suitable to, for example, use as a one chip microcomputer. Such a one chip microcomputer may be assembled into various portable and desk-top instruments, such as a controller. These portable and desk-top instruments normally utilize a battery as a power source. In view of compact design and power saving objectives, the instruments operate at a power source voltage of about 1.5 V supplied by a single dry cell battery. Consequently, it is one of the important targets of the art to lower an operation voltage of the CMOS IC.

In order to lower the operating voltage of the CMOS IC, it is necessary to reduce the threshold voltage of the MOS transistor. However, in case of lowering the threshold voltage of the CMOS transistor pair to, for example, 0.5 V which is needed for the 1.5 V operation, there is caused a problem in that a leak current of the MOS transistor increases. Therefore, electric charges in a battery are consumed rapidly even if the device using the battery is not operated. Hereinafter, this problem will be briefly discussed for better understanding of the background of the invention. AMOS transistor can be operated with currents flowing in an inverted channel region between a source region and a drain region by applying a voltage over the threshold voltage to a gate electrode and a constant voltage between the source region and the drain region. Although, as the threshold voltage being lowered, the channel region is inverted weakly, so that the currents flow between the source region and the drain region (leakage current). This mechanism will be explained by using FIG. 8 for better understanding. The curves in FIG. 8 are measurement data of drain current at the drain voltage $V_D$=0.1 V. In this graph the horizontal axis represents a gate voltage $V_G$ and the normal axis represents a drain current $I_D$ in logarithmic scale. The curves show that the drain currents are not equal to OA at the gate voltage $V_G$=0 V, therefore, the currents flow in the MOS transistor without operating the MOS transistor. In this an inversion value $V_G/\log(I_D)$ of an inclination of curve is named as a subthreshold coefficient S, which is an important value for determining a switching characteristic of the MOS transistor. A depletion layer capacity is formed just below the gate electrode in the surface of the MOS transistor. As the depletion layer capacity becomes greater, the subthreshold coefficient S becomes greater; on the contrary, as the depletion layer capacity becomes smaller, the subthreshold coefficient S becomes smaller. Further, the depletion layer capacity becomes large when the concentration of the substrate surface just below the gate electrode is high, while the depletion layer capacity becomes small when the concentration is low. Therefore, as the concentration of the substrate surface just below the gate electrode is lower, the depletion layer capacity becomes smaller, and the subthreshold coefficient S can be decreased. As a result, the MOS transistor can be operated with a narrow range of the voltage, and thereby it is possible to perform switching operation at high speed with a small consumption of electricity. Especially, in the P channel MOS transistor which is a buried channel type device, a comparatively large amount of boron is ion-implanted in order to keep the threshold voltage below 0.5 V, so that the concentration of the substrate surface is high. As mentioned before, a p-n junction is formed in a channel region of an n type well of the P channel MOS transistor having the N type polysilicon gate electrode and the buried channel. Thus, in the P channel MOS transistor, a level of the minimum potential does not exist at a boundary between a silicon substrate and a gate oxide film, but exists in an internal portion of the substrate to form a buried channel. As the p-n junction becomes deep, the level of the minimum potential shifts into the internal portion of the substrate to enhance a degree of the buried channel. Consequently, carriers in the buried channel are made free from surface scattering specific to the boundary to thereby increase mobility. As the amount of the ion-implanted boron increases to lower the threshold voltage, the p-n junction depth becomes deep to intensify the degree of the buried channel so that the mobility is raised.

In such a manner, the buried channel type device is advantageous, as compared to the surface channel type device, in that the mobility is much greater. However, the buried channel type device suffers from a most serious drawback in that a short channel effect is easily induced. This short channel effect causes secondary drawbacks such as increase in a leak current, degradation of a subthreshold characteristic and reduction in a punch-through breakdown voltage. In order to suppress such a short channel effect in the P channel MOS transistor of the buried channel type, the p-n junction depth must be set as shallow as possible, so that the P channel MOS transistor becomes closer to the surface channel type device. However, it is practically difficult to establish a quite shallow p-n junction depth. Conventionally, boron is ion-implanted to carry out the channel doping. A shallow diffusion layer cannot be formed because of relatively great diffusion coefficient of boron. Particularly, boron is ion-implanted by a great amount so as to suppress the threshold voltage at about 0.5 V, thereby rendering a deep p-n junction depth.

Aside from the above, in order to suppress the short channel effect of the P channel MOS transistor, it is known to form a surface channel type of the P channel MOS transistor like the N channel MOS transistor. Namely, an N type/P type bipolar gate structure is adopted instead of N type unipolar gate structure. In such a case, a P type polysilicon gate material is used as a gate electrode of the P channel MOS transistor. However, the N type/P type bipolar gate structure disadvantageously complicates not only fabrication process but also IC design. Particularly, a junction structure of lead lines is complicated to obtain an ohmic contact to opposite polarities of the gate electrodes, thereby disadvantageously enlarging IC chip size. In contrast, the N type unipolar gate structure has the advantages such as simple process and design and small chip size.

SUMMARY OF THE INVENTION

In view of the above noted problems and drawbacks of the prior art, an object of the invention is to achieve low voltage and high speed operation while suppressing a leak current and lowering a sub-threshold coefficient in the PMOS transistor of the CMOS transistor pair. The following means is adopted in order to achieve the object. Namely, in the semiconductor device containing a CMOS transistor pair composed of a P channel MOS transistor having a polysilicon gate and an N channel transistor having a polysilicon gate, the production method thereof is characterized by a channel doping step such that $BF_2^+$ is ion-implanted into the semiconductor substrate to form a channel dope layer in a vicinity of a surface of the substrate. In this step, an acceleration energy in the ion-implantation is set under 30 KeV. Preferably, a gate insulating film of the MOS transistor is formed prior to the channel doping step.

Preferably, after the channel doping step, phosphorus is ion-implanted into a p type region of the N channel MOS transistor to form source/drain regions thereof without effecting drive-in thermal process of $N^+$ source/drain. Further preferably, phosphorus is ion-implanted into a semiconductor substrate of a $P^-$ type at a dose of $1\times10^{12}$ to $3\times10^{12}/cm^2$, more preferably $2\times 10^{12}cm^2$, to form an n type well which defines the n type region of P channel MOS transistor. In addition, the gate insulating film of the MOS transistor is formed at a thickness of about 100 Å to 200 Å, more preferably about 150 Å.

According to the inventive production method of the semiconductor device, in place of the conventionally used boron B, $BF_2^+$ is ion-implanted to form the p type channel dope layer confined in the vicinity of the channel surface. Since the boron compound $BF_2^+$ has a molecular weight greater than that of the boron element B, its range is smaller in the ion-implantation on an acceleration energy under 30 KeV. Consequently, the p type impurity layer can be formed quite shallow and a distribution of the impurity in depth direction can be suppressed, thereby a lower impurity concentration just below the gate electrode in a surface of the substrate can be achieved. Further according to the invention, prior to the channel doping step to form a channel doping layer, the gate insulating film of the MOS transistor is formed by a thermal oxidation process. Thereafter, the p type channel layer is formed so that it is not subjected to hysteresis of the thermal oxidation, thereby suppressing thermal impurity diffusion to maintain the quite shallow p-n junction depth. Further, as there occurs decrease in concentration of the impurity included in the substrate surface which is necessary for adjusting the threshold voltage when the impurity is thermally diffused, it is necessary to increase the channel doping amount of the impurity in advance in order to prevent the decrease in concentration. However, in the present invention it is unnecessary to take such measures. Increasing the channel doping amount is increasing the impurity concentration of the substrate surface. For the same reason, after the channel doping step, phosphorus is ion-implanted in place of the conventionally used arsenic into the p type region of the N channel MOS transistor to form the source/drain regions. Phosphorus has a diffusion coefficient greater than arsenic, hence a sufficient impurity region can be obtained without thermal process or annealing.

Consequently, the succeedingly formed channel dope layer can be free from thermal hysteresis which would cause an ill affect. Further, when forming the n type well, i.e., the n type region of the P channel MOS transistor in the $P^-$ type of the semiconductor substrate, the dose of phosphorus is reduced by half as compared to the prior art. Therefore, the threshold voltage can be achieved the same as the conventional threshold voltage in a case of less amount of channel doped impurity, and the impurity concentration of the substrate surface just below the gate electrode becomes lower and it is possible to diminish the subthreshold coefficient of the P channel MOS transistor sufficiently. Furthermore, the leak current can be suppressed even if the threshold voltage is low. In addition, according to the invention, the gate insulating film of each MOS transistor is made thin in the order of 150 Å thickness. Accordingly, device miniaturization is realized to meet "0.8 μm rule", and concurrently higher operation speed and low leakage current can be achieved.

DETAILED DESCRIPTION OF THE PREFERRED

Embodiments

Figure 1:
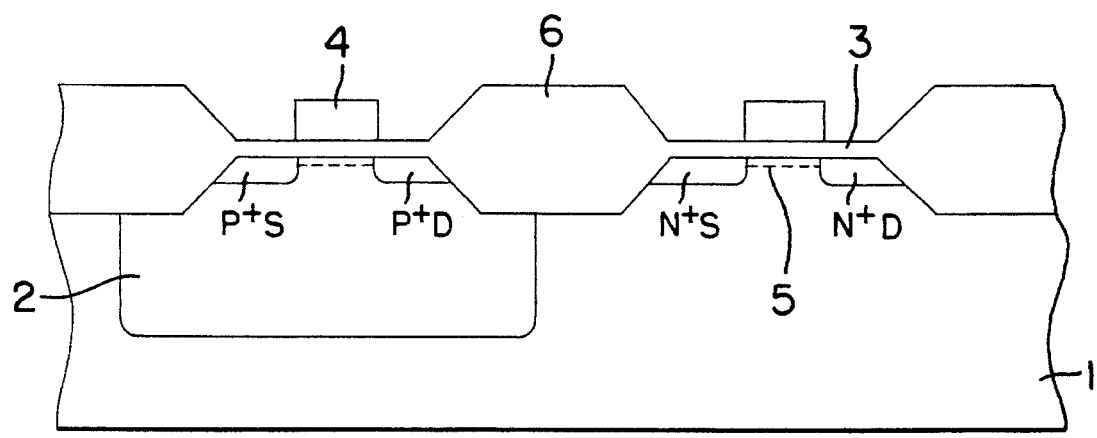
FIG. 1 is a schematic partial section showing a structure of a CMOS transistor according to the present invention.

Hereinafter, preferred embodiments of the invention will be described in detail with reference to the drawings. FIG. 1 is a schematic partial sectional view showing a structure of the inventive CMOS transistor pair. This transistor is formed of a p⁻ type Si substrate 1. An n type well 2 is formed in a surface portion of the substrate 1. This n type well 2 is optimized to a low impurity density such that, for example, phosphorus of the n type impurity is doped at a dose of $2\times10^{12}/cm^2$ by ion implantation. A gate oxide film (Gate Ox) 3 is formed on the surface of the substrate 1. This gate oxide film 3 is preferably made thin such that, for example, its thickness is set at 150 Å. An N type polysilicon gate electrode (N type poly Si Gate) 4 is patterned over the gate oxide film 3. A channel dope layer 5 is formed under the gate oxide film 3 just below the gate electrode 4. This channel dope layer 5 has a shallow p-n junction depth (xj) in the order of, for example, 0.15 μm. A P channel MOS transistor is formed in an n well 2 and an N channel MOS transistor is formed in a P type silicon substrate 1. Those two type MOS transistors are separated by a field oxide layer 6. An impurity is densely doped into opposite sides of the channel dope layer 5 to form a pair of P type/N type source region S and P type/N type drain region D.

Figure 2:
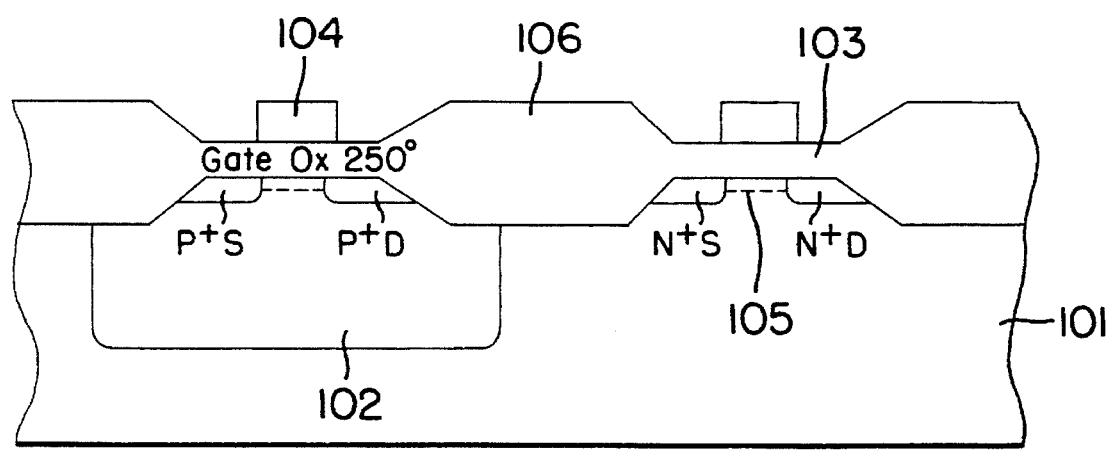
FIG. 2 is a schematic partial section showing a conventional structure.

For comparing the inventive construction shown in FIG. 1, the corresponding conventional construction is illustrated in FIG. 2. In manner similar to the FIG. 1 construction, a P channel MOS transistor of a CMOS pair is formed in a p⁻ type Si substrate 101. An n type well 102 is provided in the surface of the substrate 101. This n type well 102 contains a high density of an n type impurity as compared to the n type well 2 shown in FIG. 1. For example, the impurity phosphorus is doped at a dose of about $4\times10^{12}/cm^2$ by ion implantation. A gate oxide film 103 has a thickness of, for example, about 250 Å which is thicker than the gate oxide film 3 shown in FIG. 1. An N type polysilicon gate electrode 104 is formed on the gate oxide film in manner similar to the gate electrode 4 shown in FIG. 1. The p channel transistor and N channel transistor are separated by the field oxide film 106. Lastly, a channel dope layer 105 formed just under the gate electrode 104 has a relatively deep p-n junction depth xj in the order of, for example, about 0.34 μm.

Figure 3:
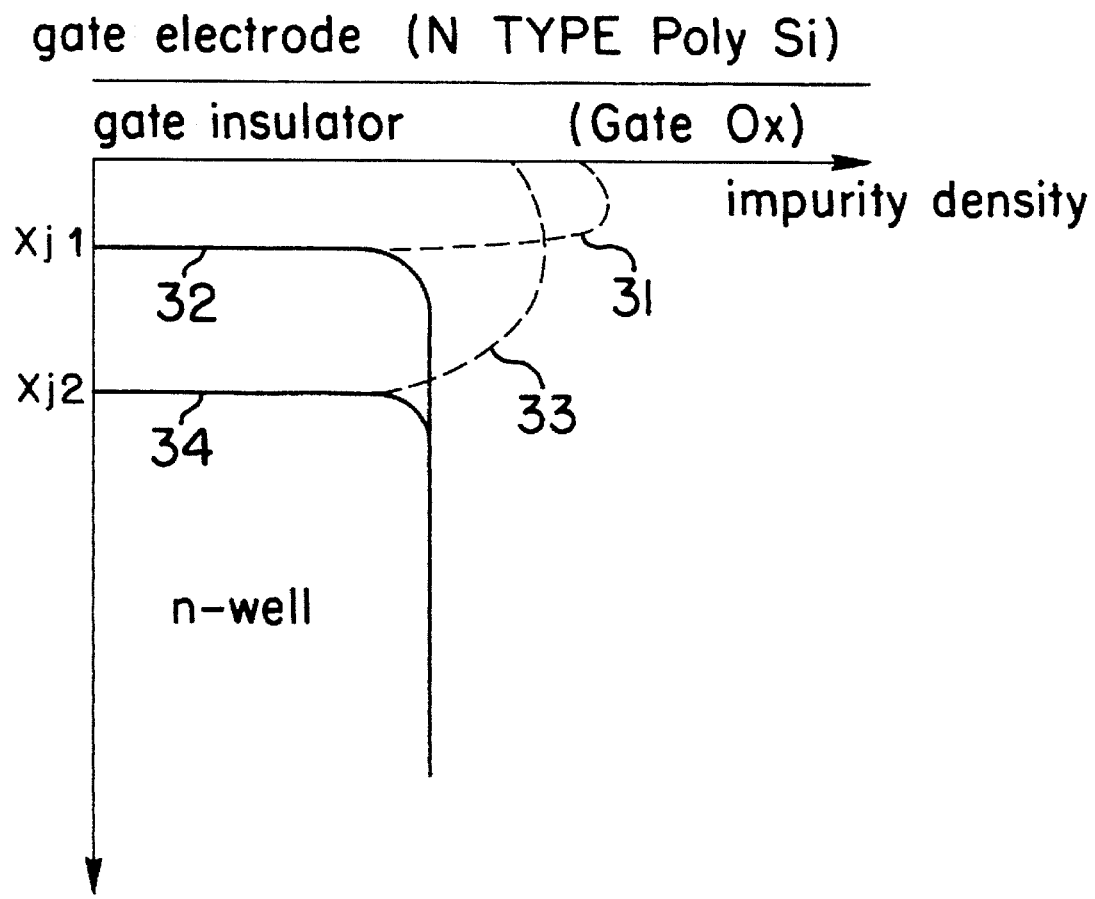
FIG. 3 is a graph showing a depth profile of a boron density in a p type channel dope layer.

The detailed description will be given next for the various inventive features in comparison between the inventive MOS construction of FIG. 1 and the conventional MOS construction of FIG. 2. FIG. 3 is a graph showing a density depth profile of the impurity boron in the n type well. The vertical axis denotes a depth and the horizontal axis denotes an impurity density in the graph. In this graph, the conditions of acceleration energy in ion-implantation process are the same in both the present and conventional cases. In FIG. 3, the dashed lines and solid lines show the cases of boron (p type) impurity and phosphorous (N type) impurity respectively. The curves 31 and 32 are the cases of the inventive sample, and curves 33 and 34 are the case of the conventional sample. In an inventive sample, the density profile curve sharply falls in the vicinity of the n type well surface, such that the p type channel dope layer is localized and confined in the vicinity of the surface. Consequently, the p-n junction depth xj1 is quite shallow. On the other hand, in a conventional sample, the profile curve gradually falls so that the p type channel dope layer has a broad distribution within the n type well. Consequently, the p-n junction depth xj2 is positioned in a reatively deep level. Accordingly, an impurity density of the invention is thinner than the normal one.

Figure 4:
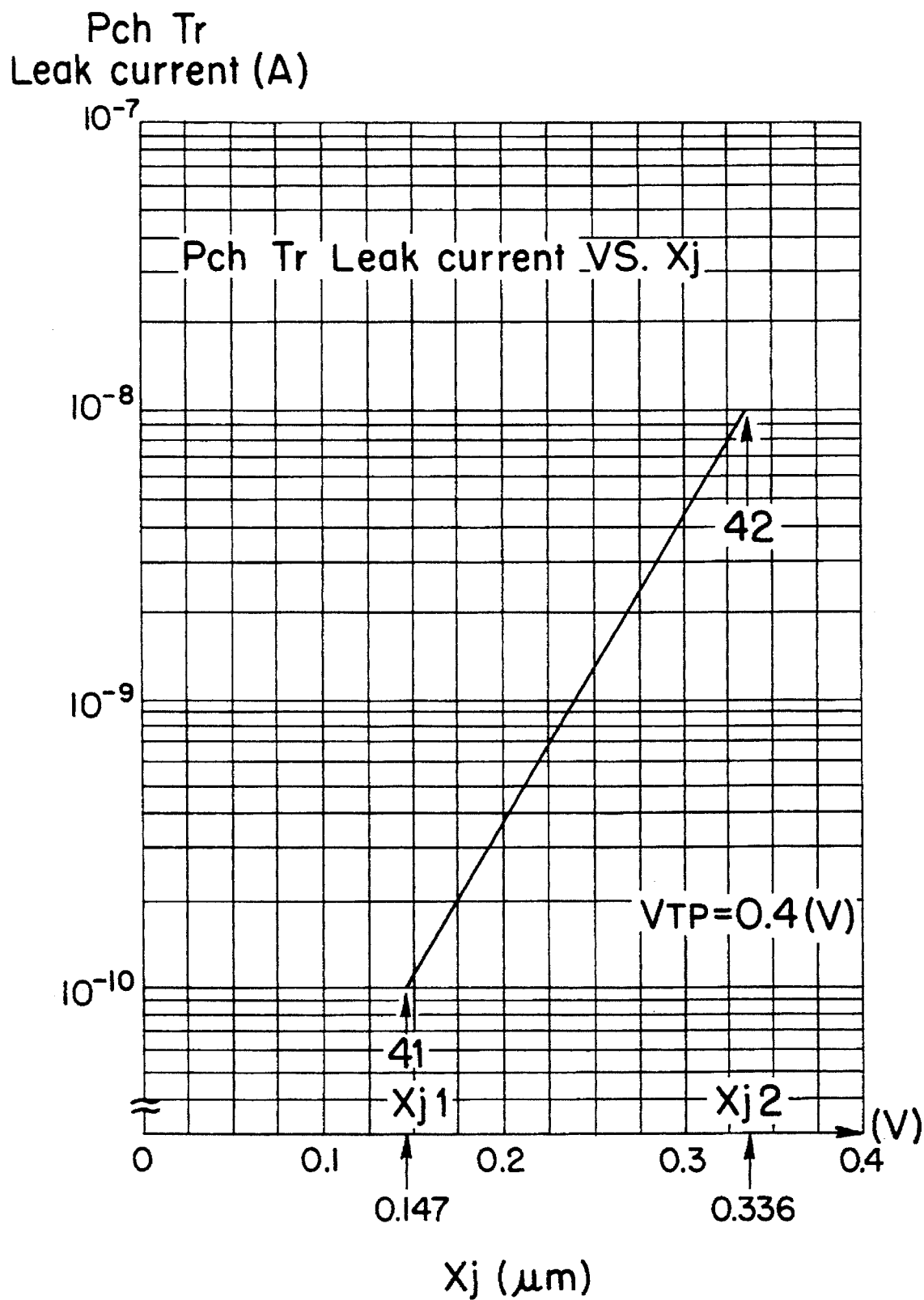
FIG. 4 is a graph showing the relation between a leak current and a p-n junction depth of a P channel MOS transistor.

FIG. 4 is a graph showing the relation between a leak current of the P channel MOS transistor (Pch Tr) and a p-n junction depth xj. The vertical axis denotes the leak current (A) in a logarithmic scale, and the horizontal axis denotes the junction depth xj in the μm unit. As described before, the FIG. 1 inventive construction has the junction depth xj1 of about 0.15 μm, and the FIG. 2 conventional construction has the junction depth xj2 of about 0.34 μm. As seen from the graph, the leak current of an inventive sample 41 is reduced to the order of $10^{-10}$ A, while the leak current of a conventional sample 42 is in the order of $10^{-8}$ A. In the measurement of this graph, a threshold voltage $V_{TP}$ of the P channel MOS transistor is set to 0.4 V. As understood from the measurement results, by reducing the p-n junction depth xj, the short channel effect etc. can be effectively suppressed to thereby significantly reduce the leak current. It is preferred to limit the junction depth xj within 0.2 μm in order to suppress the leak current by one order as compared to the prior art.

Figure 5:
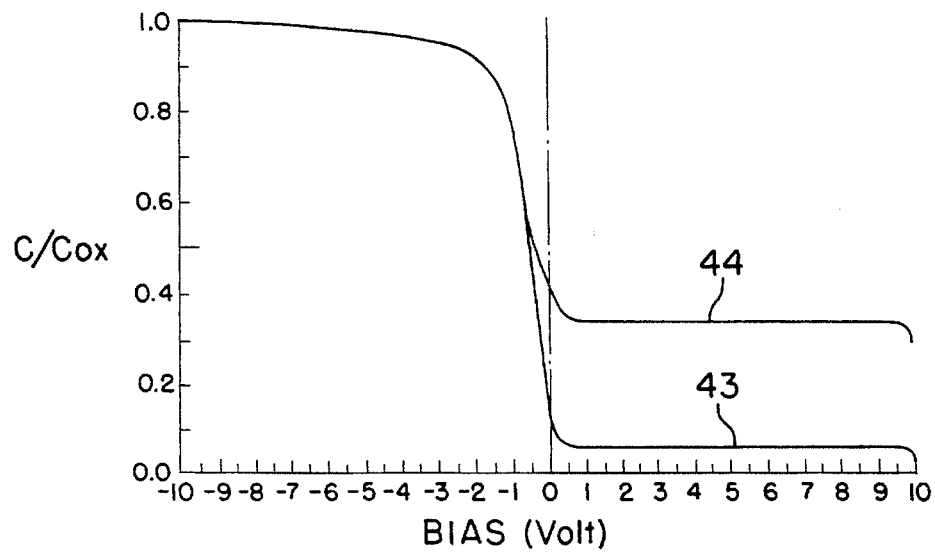
FIG. 5 shows a capacitance characteristics of a MOS structure doped P type impurity.

The second feature of the inventive device is such that the thickness of the gate oxide film is optimized relatively thin as compared to the prior art. While the prior art device has a gate oxide film thickness of about 250 Å, the inventive device has a thinner gate oxide film thickness of about 150 Å. The gate oxide film thickness of 150 Å can meet the "0.8 μ rule" to facilitate device micronization. Reduction in the gate oxide film thickness can improve the transistor operating characteristics. FIG. 5 is a graph showing the capacitance characteristics of the MOS transistor structure which is formed by doping P type impurity in the channel of the P⁻ type Si substrate. Conditions of the above doping is to use an acceleration energy of 25 KeV. In this graph, a normal axis represents a capacity (c/cox) and a horizontal axis represents a voltage (BIAS). A region where the BIAS is negative shows an oxide film capacity and a region where the BIAS is positive indicates a substrate capacity. As is evident from the graph, the substrate capacity of the present invention sample 43 is smaller than that of the conventional sample 44, for a width of the inventive depletion layer on the substrate surface is larger than that of the conventional sample. As the impurity concentration is lower, the width of the depletion layer becomes larger. In other words, the impurity concentration on the substrate surface is lower in the present invention as compared with the conventional type.

Figure 6:
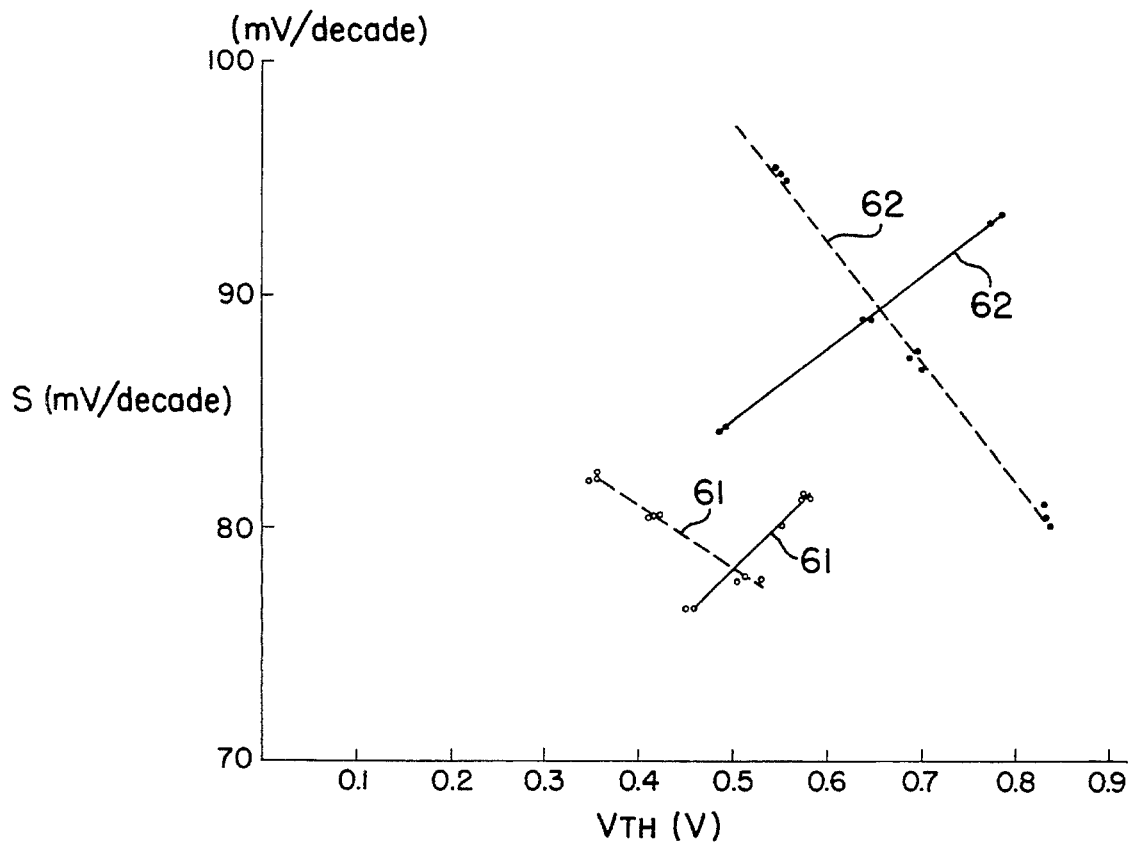
FIG. 6 is a graph showing the relation between a subthreshold coefficient and a threshold voltage of the MOS transistor.

FIG. 6 is a graph showing a relationship between a threshold voltage $V_{TH}$ of the MOS transistor and a subthreshold coefficient S. In this graph, a normal axis represents the subthreshold coefficient S (mV/decade) and a horizontal axis represents the threshold voltage $V_{TH}$ (V). In FIG. 6, the dashed lines and the solid lines show the cases of P channel MOS transistor and N channel MOS transistor respectively. The curves 61 and 62 are the cases of the inventive sample and the conventional sample respectively. As mentioned above, in the present invention shown in FIG. 1, a depth of a buried channel is quite shallow, 0.15 μm from a semiconductor surface of the channel region and a total impurity concentration just below the gate electrode is low; while in the prior art shown in FIG. 2, the depth is deeper, 0.34 μm and the total impurity concentration just below the gate electrode is high. Further, in the present invention, as an n well is lower in concentration compared with the prior art, the threshold voltage can be adjusted with a small amount of channel-doping in the P channel MOS transistor. Because of this reason also, the total impurity concentration just below the gate electrode is low. Further more, the gate oxide film is thinner, approximately 150 Å while it is conventionally around 250 Å. As evident from the graph, when the threshold voltage $V_{TH}$ of the P channel MOS transistor is 0.5 V, for example, the subthreshold coefficient S of the present invention is 77.2 mV/decade and decreases while that of the prior art is 97.2 mV/decade. When the threshold voltage $V_{TH}$ of the N channel MOS transistor also 0.5 V, for example, the subthreshold coefficient S of the present invention is 78.2 mV/decade and decreases while that of the prior art is 84.7 mV/decade. Moreover, this graph indicates that when the threshold voltage $V_{TH}$ becomes lower, the subthreshold coefficient S becomes larger in the case of the P channel MOS transistor and becomes smaller in the case of the N channel MOS transistor. This relationship will be further explained in detail below.

Figure 7:
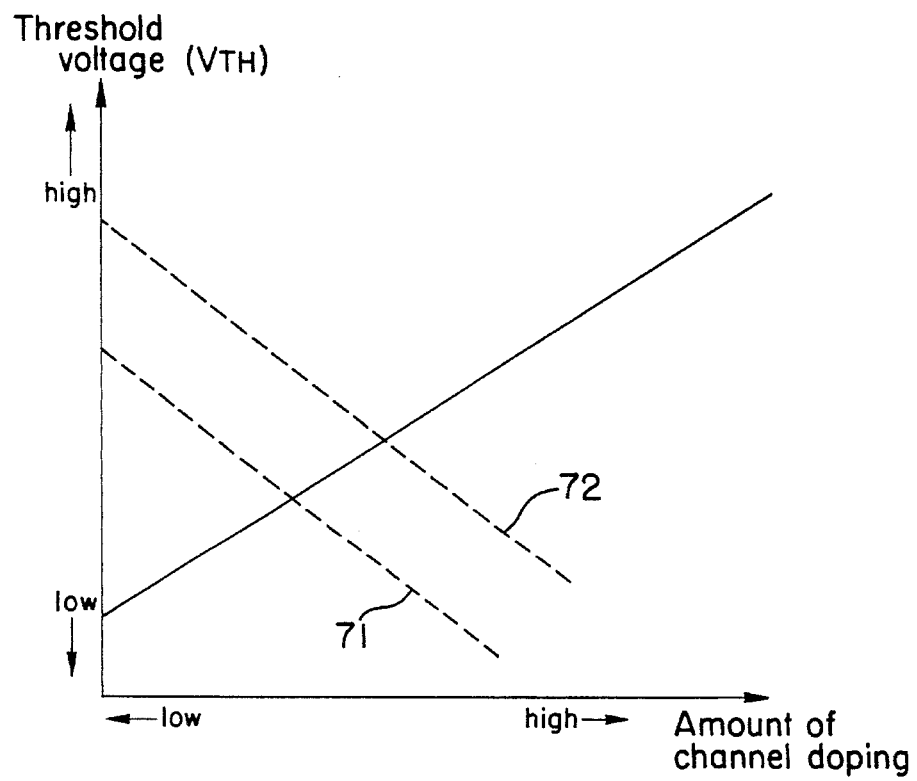
FIG. 7 is a graph showing the relation between a threshold voltage and an amount of channel doped impurity.

As shown in FIG. 7, in the case of the P channel MOS transistor, the channel-doping amount is changed to 1×10$^{12}$/cm$^2$ in order to get the threshold voltage $V_{TH}$ of 0.6 V and to 2×10$^{12}$/cm$^2$ in order to get the threshold voltage of 0.4 V, for example, and then the threshold voltage is adjusted. Further, as the concentration of the n well is low, the channel doping amount is changed to 1.5×10$^{12}$/cm$^2$ in order to get 0.4 V. As to the N channel MOS transistor, for example, the channel-doping amount is changed to 2×10$^{12}$/cm$^2$ for getting the threshold voltage of 0.6 V and to 5×10$^{11}$/cm$^2$ for 0.4 V. In this graph, a normal axis represents the threshold voltage $V_{TH}$ of the MOS transistor and a horizontal axis represents the channel-doping amount. In FIG. 7, the dashed lines and the solid line show the cases of P channel MOS transistor and N channel MOS transistor respectively. The curves 71 and 72 are the cases of the invention type (N well 2×10$^{12}$/cm$^2$) and the conventional type (N well 4×10$^{12}$/cm$^2$) respectively. In other words, when the threshold voltage of the P channel MOS transistor is low and that of the N channel MOS transistor is high, the doping amount is large and the concentration of the substrate surface just below the gate electrode is high, so that the subthreshold coefficient S is large; when the threshold voltage of the channel MOS transistor is high and that of the N channel MOS transistor is low, the doping amount is small and the concentration is low, as a result the subthreshold coefficient S is small.

Figure 8:
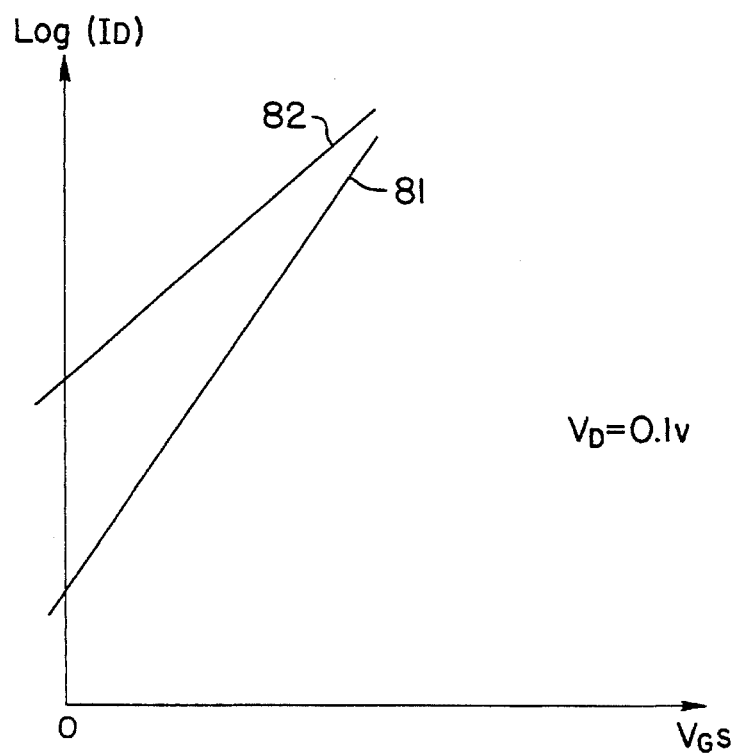
FIG. 8 is a graph showing the subthreshold characteristics of the MOS transistor.

FIG. 8 shows subthreshold characteristics of the MOS transistor in which the threshold voltage $V_{TH}$=0.5 V. In this graph, a horizontal axis represents a gate voltage $V_G$ and a normal axis represents a drain current $I_D$ in logarithmic memory. In FIG. 8, the curves 81 and 82 show the cases of the inventive sample and the conventional sample respectively. Data shown in this graph is measured at the drain voltage $V_D$= 0.1 V. An inclination showing the characteristics of the prior art is small which means that the subthreshold coefficient S is large, on the other hand, that of the present invention is large which means that the subthreshold coefficient S is small. It is evident from the graph that the drain current $I_D$ of the present invention becomes smaller than that of the prior art, for instance, when the gate voltage $V_G$ is 0 V. The above means that a leak current is smaller in the present invention than in the prior art.

Figure 9:
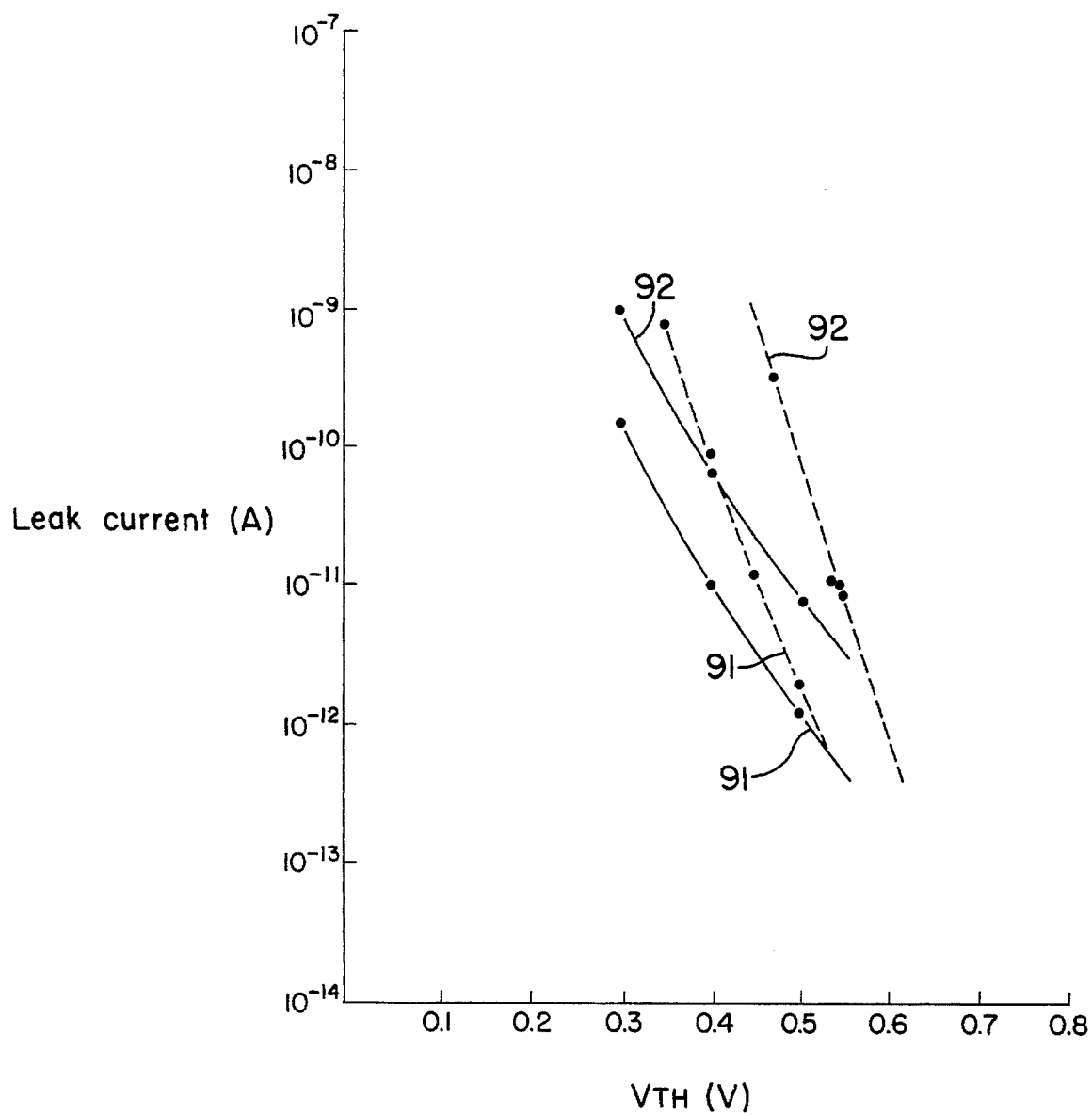
FIG. 9 is a graph showing the relation between a leakage current and a threshold voltage.
Figure 10A:
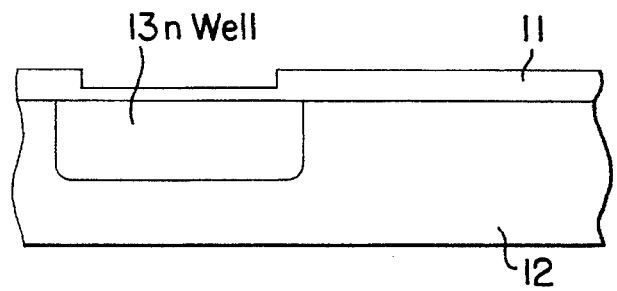
FIGS. 10A to 10H are step diagrams showing a production method of the CMOS transistor pair according to the invention.
Figure 10B:
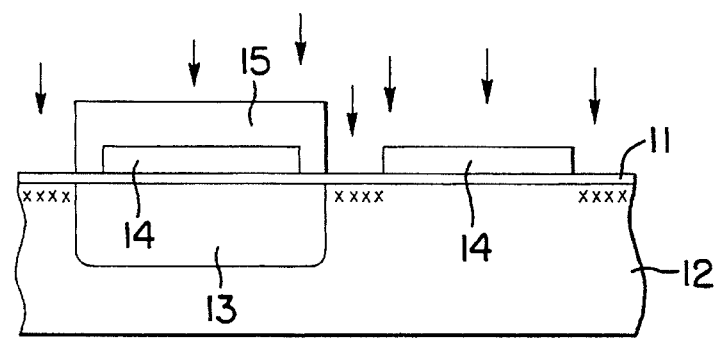
Figure 10C:
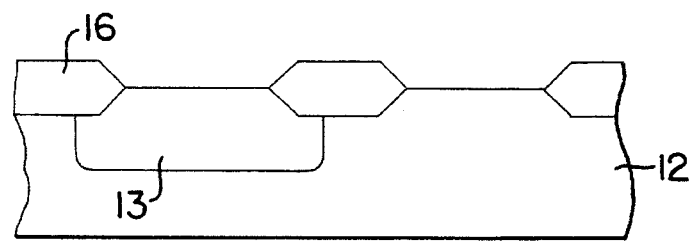
Figure 10D:
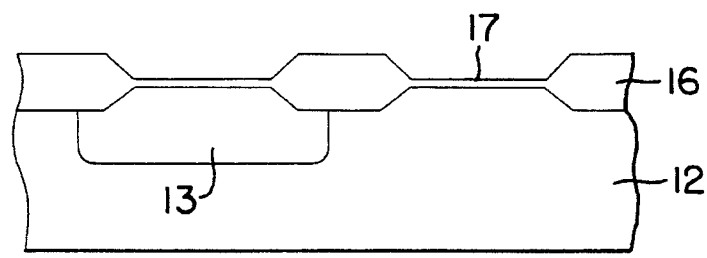
Figure 10E:
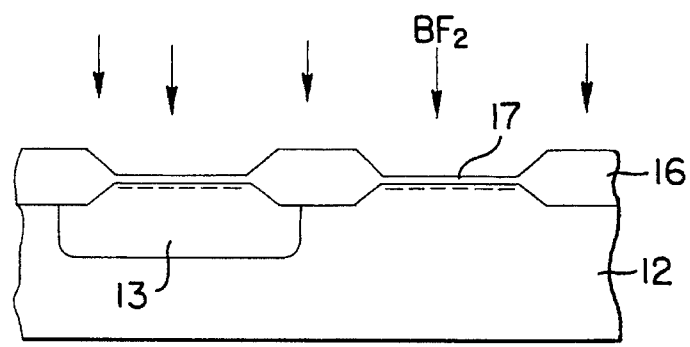
Figure 10F:
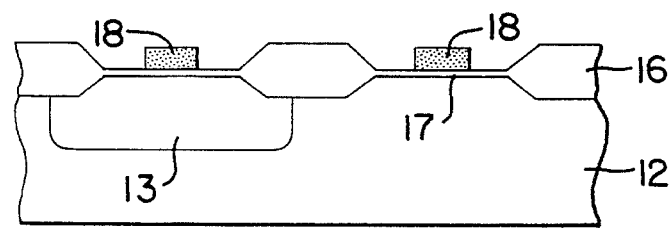
Figure 10G:
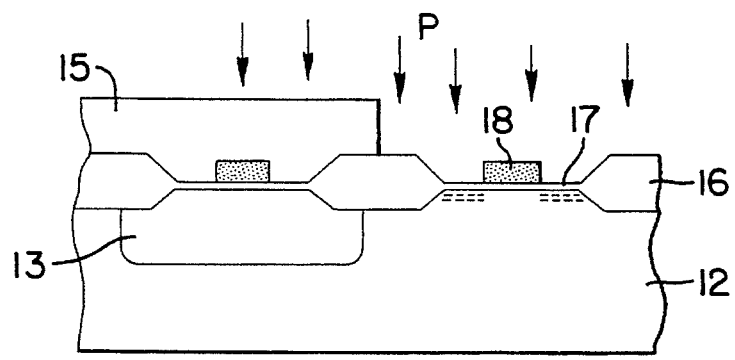
Figure 10H:
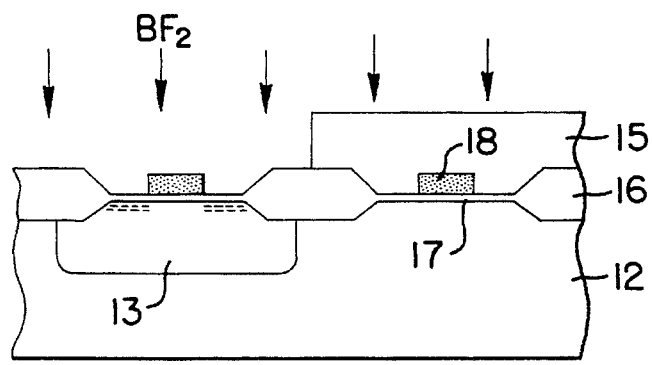

FIG. 9 is a graph showing the relationship between the threshold voltage $V_{TH}$ and the leak current in the MOS transistor. Data shown in this graph is measured at the gate voltage $V_G$=0 V and the drain voltage $V_D$=1.5 V. In this graph, a normal axis represents the leak current (A) in logorithmic memory and a horizontal axis represents the threshold voltage $V_{TH}$ (V). In FIG. 9, the dashed lines and solid lines show the cases of P channel MOS transistor and N channel MOS transistor respectively. The curves 91 and 92 are the cases of the inventive sample and the conventional sample respectively. As it is evident from the graph, when the threshold voltage is lowered to, for instance, 0.5 V in order to operate a CMOSIC at low voltage, the leak current of the P channel MOS transistor is 9×10$^{-11}$ A and that of the N channel MOS transistor is 7.5×10$^{-12}$ A in the prior art, on the other hand, that of the P channel MOS transistor is 1.9× 10$^{-12}$ A and that of the N channel MOS transistor is 1.2× 10$^{-12}$ A in the present invention and the two leak currents of the present invention decrease. As the subthreshold coefficient and the leak current can be improved in the above manner, not only does high speed drive become possible, but also low voltage drive can be facilitated. For instance, the CMOS IC having the inventive channel structure can respond to a fast drive frequency up to one MHz. The CMOS IC having such a significant characteristic is suitable for a one chip CPU, memory and microcomputer, those of which are mounted for control of various portable and desk-top instruments. These instruments may include a portable tape recorder, portable CD, pager and portable radio receiver.

Next, the description is given in detail for the inventive production method of the semiconductor device. First, referring to FIGS. 10A through 10D, the description is given up to a gate oxide film forming step in the CMOS transistor pair having the N$^+$ unipolar gate structure. In Step 10A, an n type well 13 is formed in a surface of a p type Si substrate 12. In detail, an oxide film 11 is formed on the substrate surface, and is patterned in a desired shape as a mask. Thereafter, an n type impurity of phosphorus is ion-implanted at the dose of 2×10$^{12}$/cm$^2$. As described before, this dose is reduced by half as compared to the prior art. Then, thermal treatment is carried out at 1150° C. for 6 hours to effect diffusion and activation of the doped impurity phosphorus to form the n type well 13 as shown in the figure. A P channel MOS transistor is to be formed in the n type well 13, while an N channel MOS transistor is to be formed in an adjacent region.

Step 10B is undertaken to carry out field doping. For this, firstly a silicon nitride film 14 is formed and patterned to selectively cover an active region in which is to be formed a transistor element. Particularly, a photoresist 15 is superposed on the silicon nitride film 14 over the n type well t3. In this state, an impurity of boron is ion-implanted by an acceleration energy of 30 KeV at a dose of 2×10$^{13}$/cm$^2$ to effect field doping. As shown in the figure, a field dope region is formed to surround each device region.

Subsequently in Step 10C, so-called LOCOS process is carried out to form a field oxide film 16 which surrounds the device region. Thereafter, sacrificial oxidation and associated removal treatment are carried out to eliminate remaining contaminants to thereby clean the surface of the substrate 12.

Lastly in Step 10D, thermal oxidation process is applied to the surface of the substrate 12 to form a gate oxide film 17 which covers the device region. This thermal oxidation process is conducted in H₂O gas at a substrate temperature of 860° C. to grow an oxide film at a thickness of about 150 Å. In contrast, the conventional gate oxide film has a thickness of about 250 Å.

Subsequent steps will be described with reference to FIGS. 10E through 10H. Firstly, Step E is undertaken to effect channel doping. This channel doping is directed to adjustment of the threshold voltage of the CMOS transistor pair by doping a p type impurity. In this invention, the boron compound $BF_2$ is utilized as an ion species of the p type impurity instead of the boron element B for the ion implantation. The acceleration energy is set to, for example, 25 keV. The boron compound $BF_2$ has a greater molecular weight than the boron element B so that its range is relatively short in the ion-implantation, thereby forming a channel dope layer in a quite shallow level as shown in the figure. Further, according to the invention, after forming the gate oxide film 17, the channel doping is carried out through the gate oxide film 17. Consequently, the channel dope layer is free of hysteresis of the thermal process which has been conducted in forming the gate oxide film 17, thereby maintaining a p-n junction depth as it is. On the other hand, in the prior art, the gate oxide film is formed after the channel doping so that the impurity boron is disadvantageously subjected to diffusion in the channel dope layer.

Next, in Step 10F, an $N^+$ polysilicon gate electrode 18 is formed and patterned over the gate oxide film 17 according to the regular method including CVD.

Subsequently in Step 10G, source/drain regions are formed to provide an N channel MOS transistor. In this stage, a photoresist 15 is provided to mask the n type well 13 which is assigned to a P channel MOS transistor. Then, an n type impurity of phosphorus is ion-implanted by a self-alignment utilizing the gate electrode 18 as a mask to form the source/drain regions. This ion implantation is conditioned such that the acceleration energy is set to 40 keV, and the dose is set to $3.5 \times 10^{15}/cm^2$ In contrast to the prior art, phosphorus is utilized as an n type impurity to thereby achieve a desired electroconductivity in the source/drain regions even without thermal treatment. Consequently, the channel dope layer formed in the n type well 13 is not subjected to a thermal hysteresis, thereby maintaining the quite shallow p-n junction depth as it is. On the other hand, the prior art utilizes arsenic as the n type impurity, which has a smaller diffusion coefficient than phosphorus, thereby necessitating high temperature thermal diffusion process at about 950° C. for about 30 minutes.

Lastly, in Step 10H, the remaining source/drain regions are formed for the P channel MOS transistor. In this stage, the previously formed part of the N channel MOS transistor is masked by a photoresist 15. Then, a p type impurity such as $BF_2$ is ion-implanted at a high density to form the source/drain regions. This ion implantation is conditioned such that the acceleration energy is set to 80 keV and the dose is set to $5 \times 10^{15}/cm^2$.

Figure 11:
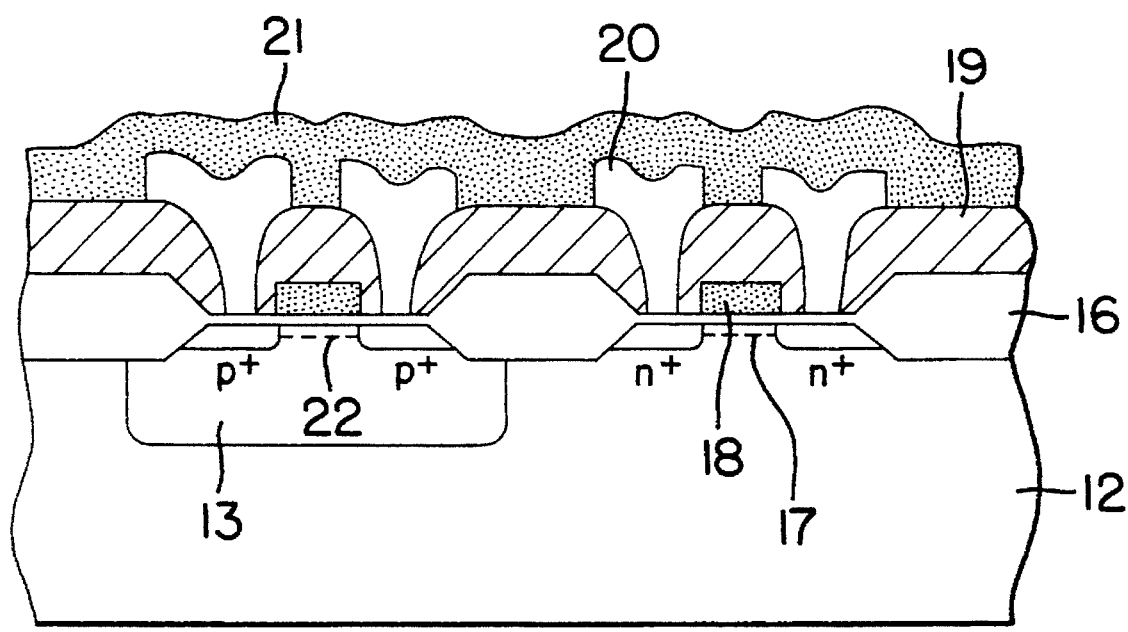
FIG. 11 is likewise a step diagram showing a completed state.

Next, the following steps including metal lead patterning will be described with reference to FIG. 11. FIG. 11 shows a completed state of the $N^+$ unipolar gate structure of the CMOS transistor pair. As shown in the figure, after forming the respective source/drain regions of the P channel and N channel MOS transistors, a BPSG inter-layer film 19 is deposited entirely. This inter-layer film 19 is formed by, for example, CVD method, and is then leveled by thermal treatment. Subsequently, the inter-layer film 19 is selectively etched to form contact holes which communicate with the source/drain regions. Thereafter, contact reflow treatment is conducted at 900° C. for about 30 minutes within $O_2/N_2$ gas.

Then, metal material is entirely deposited by vacuum evaporation or sputtering. Thereafter, photolithography and etching are carried out to form patterned metal lead lines 20. Finally, the substrate 12 is entirely coated by a surface protective film 21. The thus formed P channel MOS transistor has a channel dope layer 22 which is located in a quite shallow level in the vicinity of the surface of the n type well 13, and its p-n junction depth is adjusted at about 0.15 μm.

Lastly, referring to FIG. 12, one application of the invention will be described. This application is associated to a remote control microcomputer of the one chip type comprised of CMOS transistor pairs produced by the above described fabrication method. As shown in the figure, a microcomputer 51 receives a power source voltage through a pair of power source terminals $V_{SS}$ and $V_{CC}$. This microcomputer 51 can be operated at a relatively low voltage by using an external 1.5 V power source 52 such as a dry cell battery. A smoothing capacitor 53 is externally connected between the pair of power source terminals. An oscillating source 54 is externally connected across a pair of clock input terminals $CL_1$ and $CL_2$ to input a system clock. This oscillating source 54 is composed of, for example, ceramics having an oscillating frequency of 1 MHz. The microcomputer 51 has a low operation voltage and a just operation speed such that the microcomputer can perform fast operation in response to the system clock.

Further, an RMO terminal is connected to an infrared light emitting diode 56 through an external driver circuit 55. This infrared light emitting diode 56 transmits a signal for remote control. Moreover, a reset terminal RESET is connected to an external reset circuit 57. External switches 58 are connected to a set of switch input terminals $P_{00}$-$P_{03}$. In addition, an external key matrix 59 or a keyboard is connected to a set of interface terminals $P_{10}$-$P_{43}$.

Figure 12:
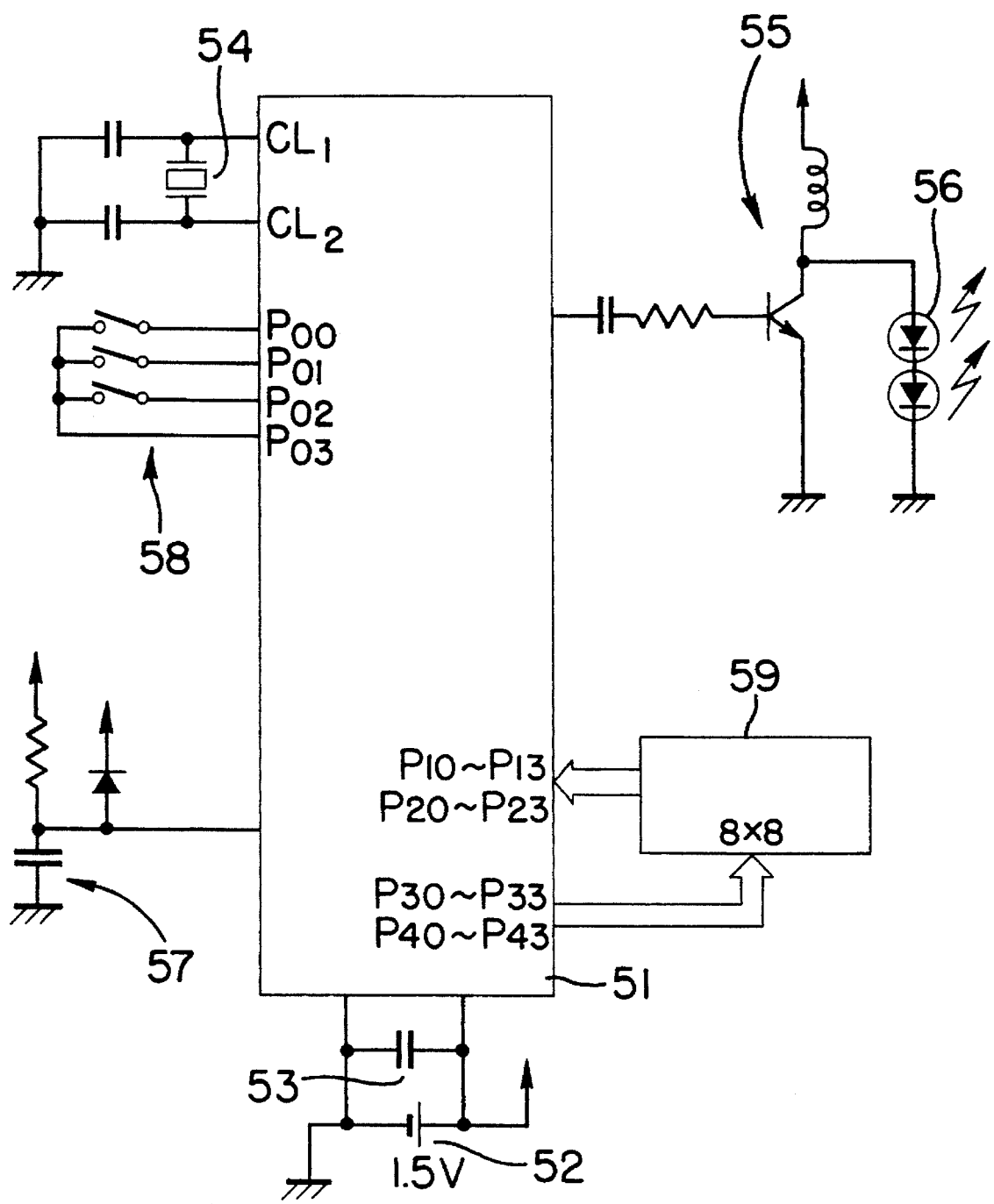
FIG. 12 is a schematic diagram showing a microcomputer of the one chip type for remote control, which is one application of the present invention.
Figure 13:
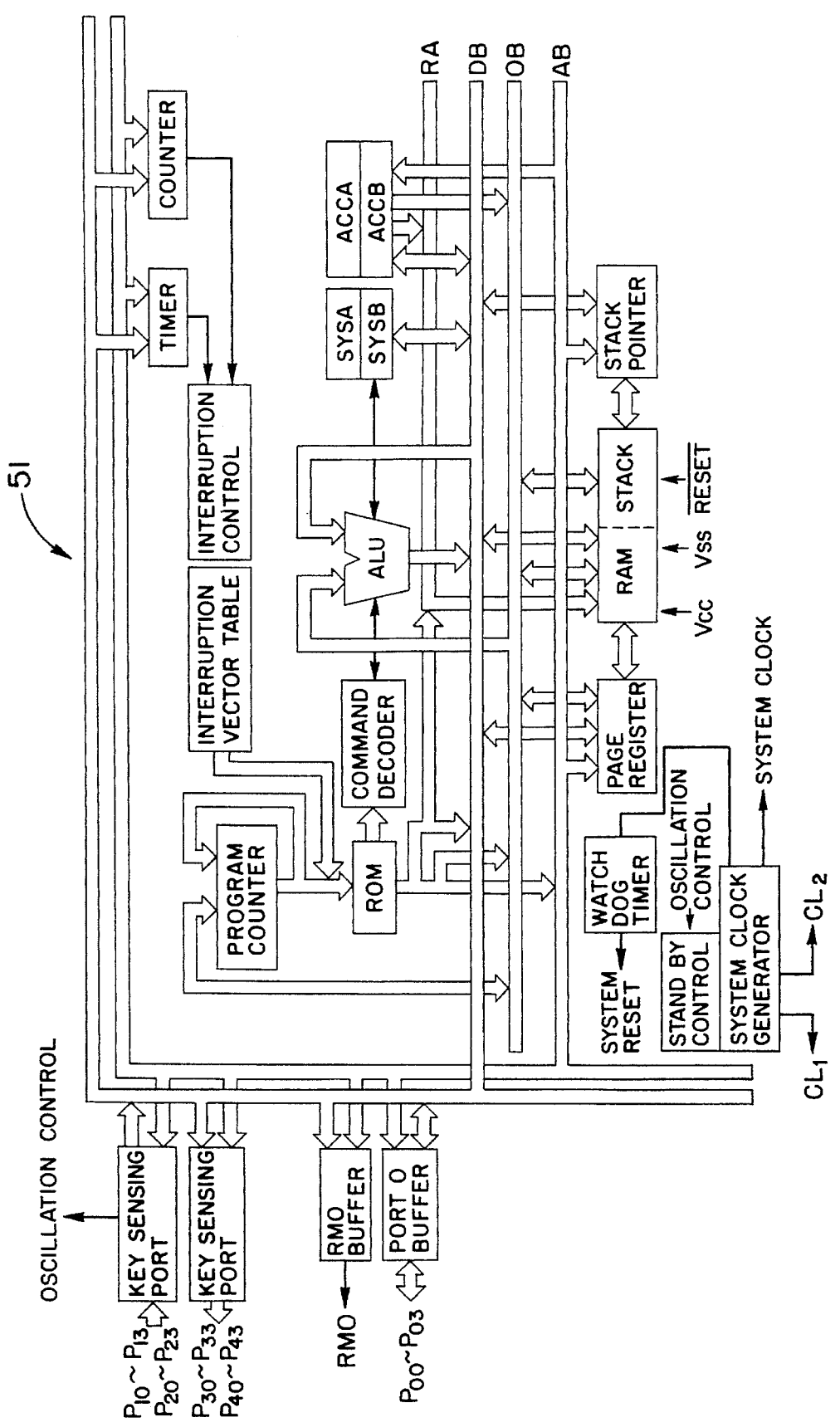
FIG. 13 is a block diagram showing an internal structure of the microcomputer shown in FIG. 12.

FIG. 13 is a block diagram showing a detailed construction of the one chip type microcomputer 51 shown in FIG. 12. As shown in the figure, the microcomputer 51 contains logical blocks such as ALU, decoder, timer and counter, all of which are comprised of CMOS transistor pairs according to the invention. Further, the microcomputer contains memory blocks such as ROM, RAM, table and register, all of which are composed of the inventive CMOS transistor pairs. The same is true for the remaining blocks such as input/output ports and buffers.

As explained above, the present invention has the following effects in a CMOS transistor which is composed of a pair of a P channel MOS transistor having a polysilicon gate and a N channel MOS transistor having also a polysilicon gate. The channel region of the MOS transistor are formed so as to have as shallow a junction depth as possible, especially the P channel MOS transistor is formed so that its structure is similar to that of a surface channel type device. Therefore, the leak current can be substantially decreased. Further, a thickness of a gate oxide film is decreased and additionally the impurity concentration of the substrate surface just below the gate electrode is lowered as much as possible. As a result, the subthreshold coefficient becomes smaller and the switching characteristics of the MOS transistor is improved, thereby the present invention has an effect that high speed operation can be realized. Accordingly, as the leak current can be restrained even when the threshold voltage is lowered, low voltage drive can be also realized as well as the high speed operation.

What is claimed is:

1. A semiconductor device containing a CMOS transistor pair, comprising: a P channel MOS transistor and an N channel MOS transistor each formed in a semiconductor substrate, the P channel MOS transistor comprising a pair of source and drain regions formed in spaced relation from each other in the semiconductor substrate, a channel dope layer formed locally in a vicinity of a surface of the semiconductor substrate between the pair of source and drain regions, a gate insulating film formed on the semiconductor substrate over the channel dope layer, and a polysilicon gate formed on the gate insulating film, wherein the channel dope layer has a p-n junction depth of about or less than 0.2 µm from the surface of the semiconductor substrate effective to suppress a leak current between the source and drain regions such that the P channel MOS transistor has a subthreshold coefficient S of less than 85 mV/decade.

2. A semiconductor device according to claim 1; wherein the P channel MOS transistor has a threshold voltage having an absolute value of less than 0.6 volts.

3. A semiconductor device according to claim 1; wherein the gate insulating film of the P channel MOS transistor has a thickness less than 200 Å.

4. A semiconductor device according to claim 1; wherein the CMOS transistor pair constitutes either of a RAM and a ROM drivable at an operating voltage in the range of 1.2 to 3.6 V.

5. A semiconductor device according to claim 1; wherein the CMOS transistor pair constitutes a CPU drivable at an operating voltage in the range of 1.2 to 3.6 V.

6. A microcomputer having a single chip containing a CMOS transistor pair, comprising: a P channel MOS transistor having a polysilicon gate and an N channel MOS transistor having a polysilicon gate, the P channel MOS transistor comprising a pair of source and drain regions formed in spaced relation from each other in an N type semiconductor layer formed in a semiconductor substrate, a channel dope layer having P type impurities formed locally in a vicinity of a surface of the N type semiconductor layer between the pair of source and drain regions, and a gate insulating film formed on the N type semiconductor layer over the channel dope layer, wherein the channel dope layer has a depth of about or less than 0.2 µm from the surface of the N type semiconductor layer such that the P channel MOS transistor has a subthreshold coefficient S of less than 85 mV/decade effective to suppress a leak current between the source and drain regions.

7. A microcomputer according to claim 6; wherein the CMOS transistor pair has an operating voltage in the range of 1.2 to 3.6 V.

8. A semiconductor device having a CMOS transistor pair, comprising; a P channel MOS transistor comprising a source region and a drain region formed in an N type semiconductor layer, a channel dope layer having P type impurities formed locally in a surface of the N type semiconductor layer between the source region and the drain region, the channel dope layer having a depth effective to suppress a leak current between the source region and the drain region to a value about or less than $10^{-9}$ amps and having a P type impurity concentration effective to suppress the threshold voltage of the P channel MOS transistor to an absolute value of less than 0.6 volts.

9. A semiconductor device according to claim 8; wherein the channel dope layer has a depth of about or less than 0.25 µm.

10. A semiconductor device according to claim 8; wherein the channel dope layer has a depth of about or less than 0.2 µm.

11. A semiconductor device according to claim 8; wherein the channel dope layer has a depth of less than 0.2 µm.

12. A semiconductor device according to claim 8; wherein the channel dope layer comprises a $BF_2^+$ ion-implanted dope layer.

13. A semiconductor device according to claim 8; wherein the channel dope layer is formed by ion-implanting $BF_2^+$ with an acceleration energy under 30 KeV into the semiconductor substrate between the source region and the drain region.

14. A semiconductor device according to claim 8; wherein the P channel MOS transistor further comprises a gate insulating film having a thickness less than 200 Å formed on the semiconductor substrate over the channel dope layer.

15. A semiconductor device according to claim 14; wherein the P channel MOS transistor further comprises a polysilicon gate formed on the gate insulating film.

16. A semiconductor device according to claim 8; further comprising an N channel MOS transistor to form a CMOS transistor pair with the P channel MOS transistor to constitute at least one of a PAM, a ROM and a CPU drivable at an operating voltage in the range of 1.2 to 3.6 V.

17. A semiconductor device according to claim 1; wherein the N channel MOS transistor has a subthreshold coefficient S of less than 85 mV/decade.

18. A semiconductor device according to claim 1; wherein the N channel MOS transistor has a threshold voltage having an absolute value of less than 0.6 volts.

19. A semiconductor device according to claim 1; wherein both of the P channel MOS transistor and the N channel MOS transistor have a threshold voltage having an absolute value of less than 0.6 volts.

20. A microcomputer according to claim 6; wherein the P channel MOS transistor has a threshold voltage having an absolute value of less than 0.6 volts.

21. A microcomputer according to claim 29; wherein the N channel MOS transistor has a threshold voltage having an absolute value of less than 0.6 volts.

22. A microcomputer according to claim 6; wherein the N channel MOS transistor has a subthreshold coefficient S of less than 85 mV/decade.

* * * * *